(12) United States Patent
Kim

(10) Patent No.: US 9,761,822 B2
(45) Date of Patent: Sep. 12, 2017

(54) LIGHT EMITTING DIODE AND DISPLAY DEVICE INCLUDING THE SAME

(71) Applicant: SAMSUNG DISPLAY CO., LTD., Yongin-si, Gyeonggi-do (KR)

(72) Inventor: Dong Chan Kim, Gunpo-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/190,267

(22) Filed: Jun. 23, 2016

(65) Prior Publication Data

US 2017/0186988 A1  Jun. 29, 2017

(30) Foreign Application Priority Data

Dec. 24, 2015  (KR) ........................ 10-2015-0185900

(51) Int. Cl.
*H01L 51/00* (2006.01)
*H01L 51/50* (2006.01)
*H01L 27/32* (2006.01)
*B82Y 20/00* (2011.01)

(52) U.S. Cl.
CPC ...... *H01L 51/5056* (2013.01); *H01L 27/3262* (2013.01); *H01L 51/502* (2013.01); *H01L 51/5072* (2013.01); *B82Y 20/00* (2013.01); *H01L 51/004* (2013.01); *H01L 51/006* (2013.01); *H01L 51/0035* (2013.01); *H01L 51/0036* (2013.01); *H01L 51/0046* (2013.01); *H01L 51/0056* (2013.01); *H01L 51/0072* (2013.01)

(58) Field of Classification Search
CPC ......... B82Y 20/00; B82Y 40/00; B82Y 15/00; H01L 27/3262; H01L 27/3244; H01L 27/3241; H01L 51/5056; H01L 51/5072; H01L 51/502; H01L 51/0035; H01L 51/004; H01L 51/0036; H01L 51/0046; H01L 51/0072; H01L 51/006; H01L 51/0056

See application file for complete search history.

(56) References Cited

U.S. PATENT DOCUMENTS

| | | | | |
|---|---|---|---|---|
| 6,501,091 | B1* | 12/2002 | Bawendi | B82Y 10/00 257/100 |
| 8,552,416 | B2* | 10/2013 | Kim | H01L 51/502 257/13 |
| 2005/0051766 | A1* | 3/2005 | Stokes | B82Y 10/00 257/17 |
| 2007/0138460 | A1* | 6/2007 | Choi | B82Y 20/00 257/13 |
| 2008/0238299 | A1* | 10/2008 | Cho | B82Y 20/00 313/503 |

(Continued)

FOREIGN PATENT DOCUMENTS

KR  10-2012-0131945 A  12/2012
KR  10-2014-0011966 A  1/2014

(Continued)

*Primary Examiner* — Nikolay Yushin
(74) *Attorney, Agent, or Firm* — Lee & Morse, P.C.

(57) ABSTRACT

A light emitting diode includes a first electrode, a second electrode facing the first electrode, and a mixture layer between the first electrode and the second electrode. The mixture layer includes a quantum dot, a hole transporting material, and an electron transporting material.

19 Claims, 8 Drawing Sheets

(56) References Cited

U.S. PATENT DOCUMENTS

| | | | | |
|---|---|---|---|---|
| 2009/0039764 A1* | 2/2009 | Cho | ..................... | B82Y 10/00 |
| | | | | 313/504 |
| 2011/0140075 A1* | 6/2011 | Zhou | ..................... | B82Y 20/00 |
| | | | | 257/13 |
| 2011/0291071 A1 | 12/2011 | Kim et al. | | |

FOREIGN PATENT DOCUMENTS

| KR | 10-2014-0121346 A | 10/2014 |
|---|---|---|
| KR | 10-1462652 B1 | 11/2014 |

* cited by examiner

LIGHT EMITTING DIODE AND DISPLAY DEVICE INCLUDING THE SAME

CROSS-REFERENCE TO RELATED APPLICATION

Korean Patent Application No. 10-2015-0185900, filed on Dec. 24, 2015, in the Korean Intellectual Property Office, and entitled: "Light Emitting Diode and Display Device Including the Same," is incorporated by reference herein in its entirety.

BACKGROUND

1. Field

Embodiments relate to a light emitting diode and a display device including the same.

2. Description of the Related Art

An organic light emitting diode (OLED) display device is a self-light-emitting display device having advantages of a wide view angle, high contrast, and a fast response time.

The organic light emitting diode display device includes organic light emitting diodes for light emitting, and in the organic light emitting diodes, electrons injected from one electrode and holes injected from another electrode are combined with each other in a light emitting layer thereby generating excitons, and energy is outputted from the excitons to emit light.

SUMMARY

Embodiments are directed to a light emitting diode including a first electrode, a second electrode facing the first electrode, and a mixture layer between the first electrode and the second electrode. The mixture layer includes a quantum dot, a hole transporting material, and an electron transporting material.

The mixture layer may include a plurality of monomeric structures. At least one of the plurality of monomeric structures may include at least one of the quantum dot and the hole transporting material and the electron transporting material. The hole transporting material and the electron transporting material may surround the quantum dot.

The hole transporting material and the electron transporting material surrounding the quantum dot may be alternately disposed.

At least one of the plurality of monomeric structures may include a plurality of quantum dots.

The quantum dot may include a plurality of quantum dots located along a direction parallel to one surface of the first electrode.

The hole transporting material may include at least one of an organic material and an inorganic material.

The hole transporting material includes one or more inorganic materials selected from a p-type oxide semiconductor including CuO, CuO$_2$, NiO, CuI, or ZnTe, a telluride, and a halide.

The hole transporting material may include one or more organic materials selected from poly(3,4-ethylenedioxythiophene) polystyrene sulfonate (PEDOT:PSS), poly-perinaphthalene (PPN), poly-p-phenylene (PpP), polythiophene (PT), C$_{60}$, 2,9-dimethyl-4-7-diphenyl-1,10 phenanthroline (BCP), bathophenanthroline (Bphen), poly(3-hexyl thiophene) (P3HT), and 2,2',7,7'-tetrakis(N,N-di-p-methoxyphenylamine) 9,9'-spirobifluorene (OMeTAD).

The electron transporting material may include an inorganic material. The inorganic material includes one or more selected from an n-type oxide semiconductor including ZnO, TiO$_2$, or FeF$_2$, and a halide.

Areas of the hole transporting material and the electron transporting material contacting the quantum dot may be equal.

The light emitting diode may further include a hole transporting layer between the first electrode and the mixture layer, and an electron transporting layer between the mixture layer and the second electrode.

Embodiments are also directed to a display device including a substrate, a transistor disposed on the substrate, and a light emitting diode connected to the transistor. The light emitting diode may include a first electrode, a second electrode facing the first electrode, and a mixture layer between the first electrode and the second electrode. The mixture layer may include a quantum dot, a hole transporting material, and an electron transporting material.

The mixture layer may include a plurality of monomeric structures. At least one of the plurality of monomeric structures includes at least one of the quantum dot and the hole transporting material and the electron transporting material that surround the quantum dot.

The hole transporting material and the electron transporting material surrounding the quantum dot may be alternately disposed.

At least one of the plurality of monomeric structures may include a plurality of quantum dots.

The quantum dot may include a plurality of quantum dots disposed along a direction parallel to one surface of the first electrode.

Areas of the hole transporting material and the electron transporting material contacting the quantum dot may be equal.

The display device may further include a hole transporting layer between the first electrode and the mixture layer, an electron transporting layer between the mixture layer and the second electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
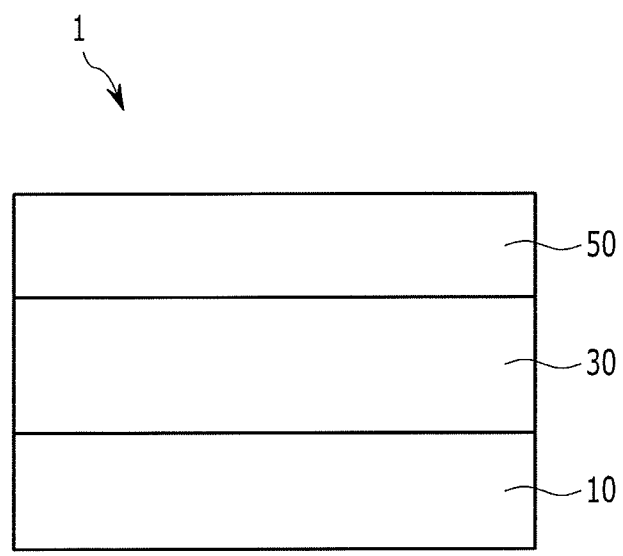
FIG. 1 illustrates a cross-sectional view of a light emitting diode according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Further, throughout the specification, the phrase "top plan view" refers to a view of a item from the top, and the phrase "on a cross-sectional view" refers to a view of a cross-section formed by vertically cutting an item from the side.

A light emitting diode according to an exemplary embodiment will now be described with reference to FIG. 1. FIG. 1 illustrates a cross-sectional view of a light emitting diode according to exemplary embodiments.

Herein, the term "quantum dot" may refer to a single quantum dot or a plurality of quantum dots as will be clearly understood according to context.

Referring to FIG. 1, a light emitting diode 1 according to an exemplary embodiment may include a first electrode 10, a second electrode 50 facing the first electrode 10, and a mixture layer 30 that is disposed between the first electrode 10 and the second electrode 20.

The first electrode 10 may be an anode, and the second electrode 50 may be a cathode. When a current is supplied to the first electrode 10 being an anode, the first electrode 10 injects holes into the mixture layer 30 to be able to have a high work function. When a current is supplied to the second electrode 50 being a cathode, the second electrode 50 injects electrons into the mixture layer 30 to be able to have a low work function. In some implementations, the first electrode may be a cathode and second electrode may be an anode.

The first electrode 10 may be a transparent electrode or an opaque electrode.

When the first electrode 10 is a transparent electrode, the transparent electrode may include, for example, indium tin oxide (ITO), indium zinc oxide (IZO), tin oxide ($SnO_2$), zinc oxide (ZnO), or a combination thereof. In some implementations, the transparent electrode may include a metal such as aluminum, silver, or magnesium with a thin thickness. The transparent electrode may be formed to have a multi-layered structure in which a conductive oxide and a metal are combined, or may be formed to have a multi-layered structure formed by one of the conductive oxide and the metal. When the first electrode 10 is an opaque electrode, the opaque electrode may include a metal such as aluminum, silver, or magnesium.

In an exemplary embodiment in which light generated in the mixture layer 30 is emitted in a direction toward the second electrode 50 and away from the first electrode 10, the first electrode 10 may include a reflective layer formed of silver (Ag), aluminum (Al), magnesium (Mg), chromium (Cr), molybdenum (Mo), tungsten (W), titanium (Ti), gold (Au), palladium (Pd), or an alloy thereof. In some implementations, the first electrode 10 may be formed to have a multi-layered structure in which a transparent electrode material layer made of ITO, IZO, or ZnO is positioned on or under the reflective layer, or is positioned both on and under the reflective layer.

The first electrode 10 may be formed by a sputtering method, a vapor phase deposition method, an ion beam deposition method, an electron beam deposition method, a heat evaporation method, or a laser ablation method, as examples.

The mixture layer 30 may be a mixture including a quantum dot, one or more hole transporting materials, and one or more electron transporting materials The quantum dot, the one or more hole transporting materials, and the one or more electron transporting materials may be uniformly or non-uniformly mixed in the mixture. For example, the quantum dot may be surrounded by the hole transporting materials and the electron transporting materials.

In the mixture layer 30, areas of the hole transporting material and the electron transporting material that contact the quantum dot may be substantially equal. Accordingly, there may be a balance in amount of holes moving through the hole transporting materials to be injected into the quantum dot and amount of electrons moving through the electron transporting materials to be injected into the quantum dot.

The quantum dot contained in the mixture layer 30 may emit primary colors such as red, green, and blue, or a combination of these colors.

The quantum dot may be selected from a group II-VI compound, a group III-V compound, a group IV-VI compound, a group IV element, a group IV compound, and a combination thereof.

The II-VI group compound may be selected from a two-element compound selected from CdSe, CdTe, ZnS, ZnSe, ZnTe, ZnO, HgS, HgSe, HgTe, MgSe, MgS, and a mixture thereof; a three-element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from a two-element compound selected from GaN, GaP, GaAs, GaSb, AlN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a four-element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof. The Group IV element may be selected from Si, Ge, and a mixture thereof. The Group IV compound may be a two-element compound selected from SiC, SiGe, and a mixture thereof.

In some implementations, a Group III-VI compound, a Group II-III-V compound, or a Group II-III-VI Group, or a combination thereof may be included.

The Group III-VI compound may include a compound such as GaO, the Group II-III-V compound may include a compound such as InZnP, and the Group II-III-VI compound may include a compound such as InZnSCdSe, as examples.

The two-element compound, the three-element compound, or the four-element compound may exist as particles at a uniform concentration. or In some implementations, two-element compound, the three-element compound, and the four-element compound may be included in the same particle while being divided to have partially different concentration distributions. In some implementations, the quantum dot may have a core/shell structure where one quantum dot compound encloses another quantum dot compound. For example, the quantum dot may have a core/shell structure including a core and a shell covering the core. An interface between the core and the shell may have a concentration gradient, such that a concentration of an element existing in the shell gradually decreases closer to a center of the interface.

The core may include one or more materials selected from CdSe, CdS, ZnS, ZnSe, CdTe, CdSeTe, CdZnS, PbSe, AgInZnS, ZnTe, CdSeS, PbS, PbTe, HgS, HgSe, HgTe, GaN, GaP, GaAs, InP, InZnP, InGaP, InGaN, InAs, and ZnO, as examples. The shell may include one or more materials selected from CdSe, ZnSe, ZnS, ZnTe, CdTe, PbS, TiO, SrSe, CdO, CdS, ZnO, InP, InS, GaP, GaN, GaO, InZnP, InGaP, InGaN, InZnSCdSe, and HgSe, as examples.

An average particle diameter of the core of the core/shell quantum dot may be 2 nm to 5 nm. An average thickness of the shell may be 3 nm to 5 nm. An average particle diameter of the quantum dot overall may be 5 nm to 10 nm. When the core, the shell, and the quantum dot satisfy the aforementioned ranges of the average particle diameter or average thickness, the quantum dot may provide an excellent distribution in a composition for forming a pattern. By variously selecting the particle diameter of the core, the average thickness of the shell, and the average particle diameter of the quantum dot within the aforementioned range, light emitting colors of the quantum dot and/or semiconductor characteristics of the quantum dot and the like may be variously changed.

The quantum dot may have a suitable form such as, for example, spherical, pyramidal, or multi-armed, or may be in a form of cubic nanoparticles, nanotubes, nanowires, nanofibers, or nanoplate-shaped particles.

The hole transporting material and the electron transporting material may include a combination of an inorganic material and another inorganic material or a combination of an organic material and an inorganic material.

For example, the hole transporting material may include at least one of an organic material and an inorganic material.

When the hole transporting material contains an organic material, the organic material may include, for example, one or more selected from poly(3,4-ethylenedioxythiophene) polystyrene sulfonate (PEDOT:PSS), poly-peri-naphthalene (PPN), poly-p-phenylene (PpP), polythiophene (PT), $C_{60}$, 2,9-dimethyl-4-7-diphenyl-1,10 phenanthroline (BCP), bathophenanthroline (Bphen), poly(3-hexyl thiophene) (P3HT), and 2,2',7,7'-tetrakis(N,N-di-p-methoxyphenylamine)9,9'-spirobifluorene (OMeTAD).

when the hole transporting material contains the inorganic material, the inorganic material may include, for example, one or more selected from a p-type oxide semiconductor, a telluride, and a halide. The p-type oxide semiconductor may include CuO, $CuO_2$, NiO, CuI, or ZnTe.

The electron transporting material may include an inorganic material.

When the electron transporting material contains an inorganic material, the inorganic material may include, for example, one or more selected from an n-type oxide semiconductor and a halide. The n-type oxide semiconductor may include ZnO, $TiO_2$, or $FeF_2$, The surface tension of one of the hole transporting material and the electron transporting material may be equal to or less than about 100 mN·m$^{-1}$, and the surface tension of the other one of the hole transporting material and the electron transporting material may be equal to or greater than about 100 mN·m$^{-1}$. A difference between the surface tension of the hole transporting material and the surface tension of the electron transporting material may be about 50 to 100 mN·m$^{-1}$.

For example, when the hole transporting material is an organic material and the electron transporting material is an inorganic material, the surface tension of the hole transporting material may be equal to or less than about 100 mN·m$^{-1}$, and the surface tension of the electron transporting material may be equal to or greater than about 100 mN·m$^{-1}$. In this case, the difference between the surface tension of the hole transporting material and the surface tension of the electron transporting material may be about 50 to 100 mN·m$^{-1}$.

When the hole transporting material is an inorganic material and the electron transporting material is an organic material, surface tension of one of the hole transporting material and the electron transporting material may be equal to or greater than about 100 mN·m$^{-1}$, and surface tension of the other one of the hole transporting material and the electron transporting material may be equal to or less than about 100 mN·m$^{-1}$. In this case, the difference between surface tension of the hole transporting material and the surface tension of the electron transporting material may be about 50 to 100 mN·m$^{-1}$.

When the hole transporting materials and the electron transporting materials have the aforementioned surface tensions, the hole transporting materials and the electron transporting materials may be mixed to form a single layer, but may be phase-separated such that routes on which holes or electrons move may be formed.

For example, the hole transporting materials included in the mixture layer 30 may be connected to each other to provide a route on which the holes move, and the electron transporting materials included in the mixture layer 30 are connected to each other to provide a route on which the electrons move.

A content ratio of the hole transporting material and the electron transporting material may be about 1:9 to 9:1. An injection balance of the holes and the electrons may be controlled according to injection characteristics of the holes and the electrons of the light emitting diode 1.

According to the exemplary embodiment, the second electrode 50 may be a cathode. The second electrode 50 may include a material having a small work function, in order to easily inject electrons into the mixture layer 30.

For example, the second electrode 50 may include a metal such as magnesium, calcium, sodium, potassium, titanium, indium, yttrium, lithium, gadolinium, aluminum, silver, tin, lead, cesium, barium, or an alloy thereof, or may include a multi-layered material such as LiF/Al, $LiO_2$/Al, LiF/Ca, LiF/Al, or $BaF_2$/Ca, as examples.

The second electrode 50 may include a conductive oxide, such as indium tin oxide (ITO), indium zinc oxide (IZO), tin oxide ($SnO_2$), zinc oxide (ZnO), or combinations thereof, or may be formed of a metal, such as aluminum, silver, or magnesium having a thin thickness. In some implementations, the second electrode 50 may have a multi-layered structure in which the aforementioned conductive oxide and metal are combined, or may be formed to have a multi-layered structure formed by a layer of the aforementioned conductive oxide and a layer of the metal.

According to the exemplary embodiment, the hole transporting materials, the electron transporting materials, and the quantum dot may be combined to form a single layer. In this case, the hole transporting materials and the electron transporting materials may contact the quantum dot over a wider area, such that the injection of holes and electrons may be easily performed to to improve light efficiency.

Figure 2:
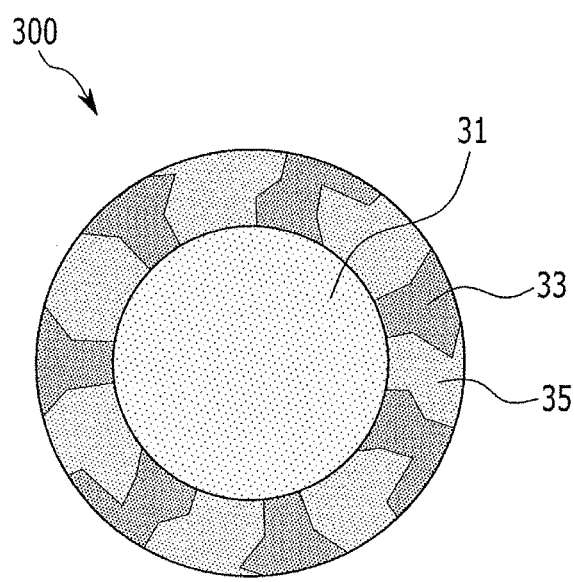
FIG. 2, FIG. 3, and FIG. 4 illustrate schematic diagrams of a light emitting diodes according to various exemplary embodiments, respectively.
Figure 3:
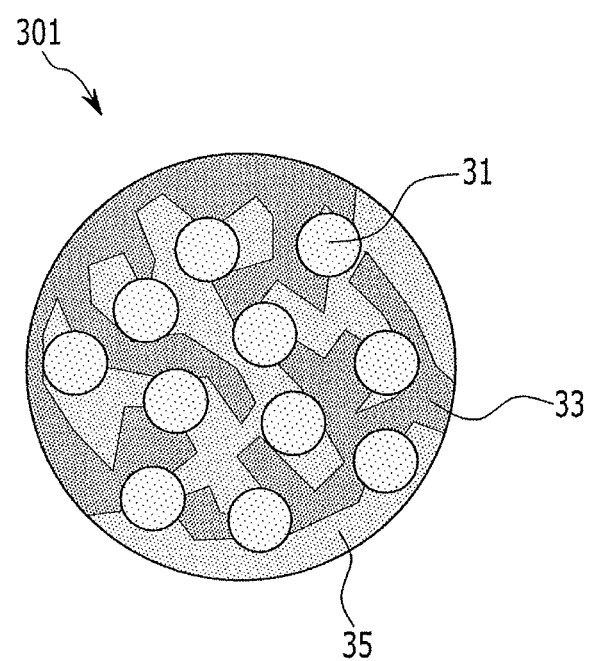
Figure 4:
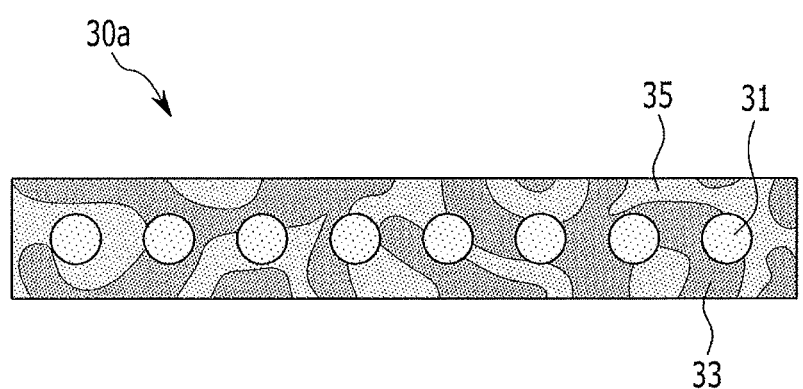

Various mixture layers according to exemplary embodiments will now be described with reference to FIG. 2 to FIG. 4. FIG. 2, FIG. 3, and FIG. 4 illustrate various exemplary embodiments of components of the mixture layer 30.

Referring to a monomeric structure 300 shown in FIG. 2, a quantum dot 31 may be surrounded by a hole transporting material 33 and an electron transporting material 35 that are alternately disposed. For example, the outer surface of the quantum dot 31 may be surrounded by the hole transporting material 33 and the electron transporting material 35, and an area over which the outer surface of the quantum dot 31 and the hole transporting material 33 directly contact each other may be substantially the same as the area over which the outer surface of the quantum dot 31 and the electron transporting material 35 directly contact each other.

The monomeric structure 300 illustrated in FIG. 2 may be formed by mixing the hole transporting material 33 and the electron transporting material 35 in a solvent that has the same polarity as a ligand of the quantum dot 31 such that a shell of the hole transporting material 33 and the electron transporting material 35 is formed on the quantum dot 31.

The mixture layer 30 according to the exemplary embodiment may include a plurality of monomeric structures, for example, a plurality of the monomeric structure 300 illustrated in FIG. 2. The hole transporting material 33 included in monomeric structure 300 may connect with the hole transporting material of others of the plurality of monomeric structures in the mixture layer 30, thereby forming a route along which the holes move. Further, the electron transporting material 35 included in the monomeric structure 300 may connect with the electron transporting material of others of the plurality of monomeric structures in the mixture layer, thereby forming a route along which the electrons move.

Referring to FIG. 3, in a monomeric structure 301 illustrated in FIG. 3, the hole transporting material 33 and the electron transporting material 35 may be uniformly or non-uniformly mixed, and a plurality of quantum dots 31 may be distributed therein. The hole transporting material 33 and the electron transporting material 35 may be irregularly mixed to form a monomeric structure 301 having a spherical shape including the plurality of quantum dots 31.

The mixture layer 30 according to the exemplary embodiment may include a plurality of monomeric structures, for example, a plurality of the monomeric structure 301 illustrated in FIG. 3. The hole transporting material 33 included in the monomeric structure 301 may connect with the hole transporting material of others of the plurality of monomeric structures in the mixture layer 30, thereby forming a route along which the holes move. Further, the electron transporting material 35 included in the monomeric structure 301 may connect with the electron transporting material of others of the plurality of monomeric structures in mixture layer 30, thereby forming a route along which the electrons move.

To manufacture the monomeric structure 301 illustrated in FIG. 3, the hole transporting material 33 and the electron transporting material 35 may be mixed in a solvent having a different polarity from the quantum dot. Next, the quantum dots 31 may be added to the solution containing the hole transporting material 33 and the electron transporting material 35.

In the resulting mixture, the quantum dots 31 having a different polarity from the solvent may form a cluster, and the hole transporting material 33 and the electron transporting material 35 may form the monomeric structure in a spherical shape as illustrated in FIG. 3.

Referring to FIG. 4, the hole transporting material 33 and the electron transporting material 35 may be uniformly or non-uniformly mixed to form a mixture layer 30a. The plurality of quantum dots 31 may be distributed inside the formed mixture layer 30a. The plurality of quantum dots 31 illustrated in FIG. 4 may be arranged to be parallel to a surface of the first electrode 10 or the second electrode 50. The plurality of quantum dots 31 may form a virtual surface that may be parallel to a surface formed by the first electrode 10 or a surface formed by the second electrode 50. The term "virtual surface" may refer to a surface formed based on an average position of the plurality of quantum dots with respect to a stacked direction of components.

Referring to a manufacturing method of the exemplary embodiment illustrated in FIG. 4, the hole transporting material 33 and the electron transporting material 35 may be mixed to form a first layer in various ways, as follows.

According to an implementation, a first layer may be formed by a solution processing method. For example, according to the solution processing method, the first layer in which the hole transporting material 33 and the electron transporting materials 35 are mixed may be formed by dissolving the hole transporting material 33 and the electron transporting materials 35 in a solvent having an opposite polarity to that of the quantum dots 31 and then spin-coating the resulting solution. A heat treatment thereof may be performed at less than 200° C.

According to an implementation, a first layer may be formed by a vacuum processing method. For example, according to the vacuum processing method, the hole transporting material 33 and the electron transporting material 35 may be co-deposited. Then, the first layer, in which the hole transporting material 33 and the electron transporting material 35 are mixed, may be formed by heat-treating to the fusing point of one of the hole transporting material 33 and the electron transporting material 35, which have a relatively low fusing point, until one of the hole transporting material 33 and the electron transporting material 35 is melted.

According to an implementation, a first layer in which the hole transporting material 33 and the electron transporting material 35 are mixed may be formed by using a hole transporting material 33 and a electron transporting material 35 having different surface tensions. The first layer in which the hole transporting material 33 and the electron transporting material 35 are mixed may be formed by inducing phase separation between the hole transporting material 33 and the electron transporting material 35, which have the aforementioned surface tension, by a difference between their surface tensions.

As described above, three methods of forming the first layer in which the hole transporting material 33 and the electron transporting material 35 are mixed are provided, as examples.

Quantum dots 31 may be coated onto the first layer in which the hole transporting material 33 and the electron transporting material 35 are mixed. Then, a second layer in which the hole transporting material 33 and the electron transporting material 35 are mixed may be formed on the quantum dots 31 by the same method as the aforementioned methods.

The first layer and the second layer may coalesce such that the quantum dots 31 are distributed in one layer in which the hole transporting material 33 and the electron transporting material 35 are mixed, thereby providing the mixture layer 30a as shown in FIG. 4.

Figure 5:
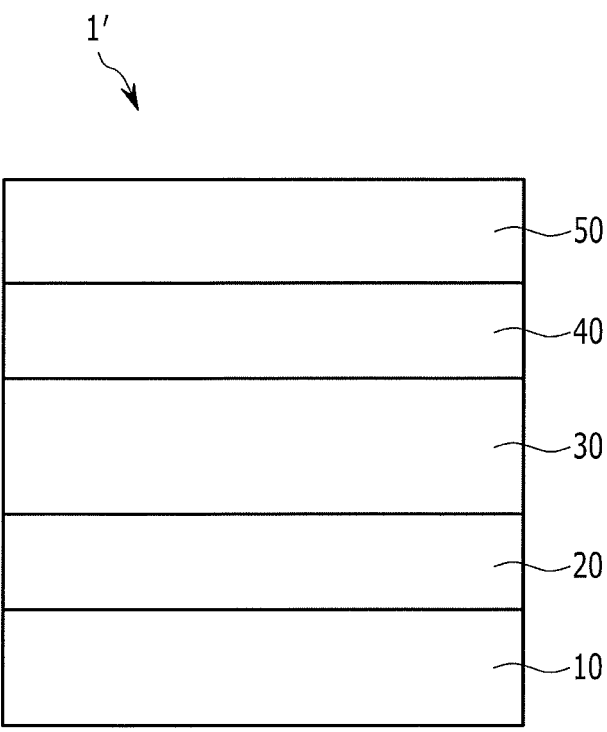
FIG. 5 illustrates a cross-sectional view of a light emitting diode according to a modified exemplary embodiment of FIG. 1.

A light emitting diode according to the exemplary embodiment will now be described with reference to FIG. 5. FIG. 5 illustrates a cross-sectional view of a light emitting diode according to a modified exemplary embodiment of FIG. 1.

Referring to FIG. 5, a light emitting diode 1' may include the first electrode 10, the second electrode 50 facing the first electrode 10, the mixture layer 30 disposed between the first electrode 10 and the second electrode 50, a hole transporting layer 20 disposed between the first electrode 10 and the mixture layer 30, and an electron transporting layer 40 disposed between the mixture layer 30 and the second electrode 50. The first electrode 10, the mixture layer 30, and the second electrode 50 may be the same as those described above with reference to FIG. 1. Accordingly, a description thereof will not be repeated.

The hole transporting layer 20 may transport holes injected from the first electrode 10 to the mixture layer 30. The hole transporting layer 20 may include at least one of an organic material and an inorganic material.

When the hole transporting layer 20 contains an organic material, the organic material may include, for example, one or more selected from PEDOT:PSS, poly-peri-naphthalene (PPN), poly-p-phenylene (PpP), polythiophene (PT), $C_{60}$, BCP, bathophenanthroline (Bphen), poly(3-hexyl thiophene) (P3HT), and OMeTAD.

When the hole transporting layer 20 contains an inorganic material, the inorganic material may include, for example, one or more selected from a p-type oxide semiconductor including CuO, $CuO_2$, NiO, CuI, or ZnTe, a telluride, and a halide.

The electron transporting layer 40 may be disposed between the mixture layer 30 and the second electrode 50. The electron transporting layer 40 may allow the electrons injected from the second electrode 50 to easily move.

The electron transporting layer 40 may include an inorganic material. When the electron transporting layer 40 includes an inorganic material, the inorganic material may include, for example, one or more selected from an n-type oxide semiconductor including ZnO, $TiO_2$, or $FeF_2$, and a halide.

The hole transporting layer 20 and the electron transporting layer 40 may have the same composition or a different composition from the hole transporting material 33 and the electron transporting material 35 included in the mixture layer 30, respectively.

Figure 6:
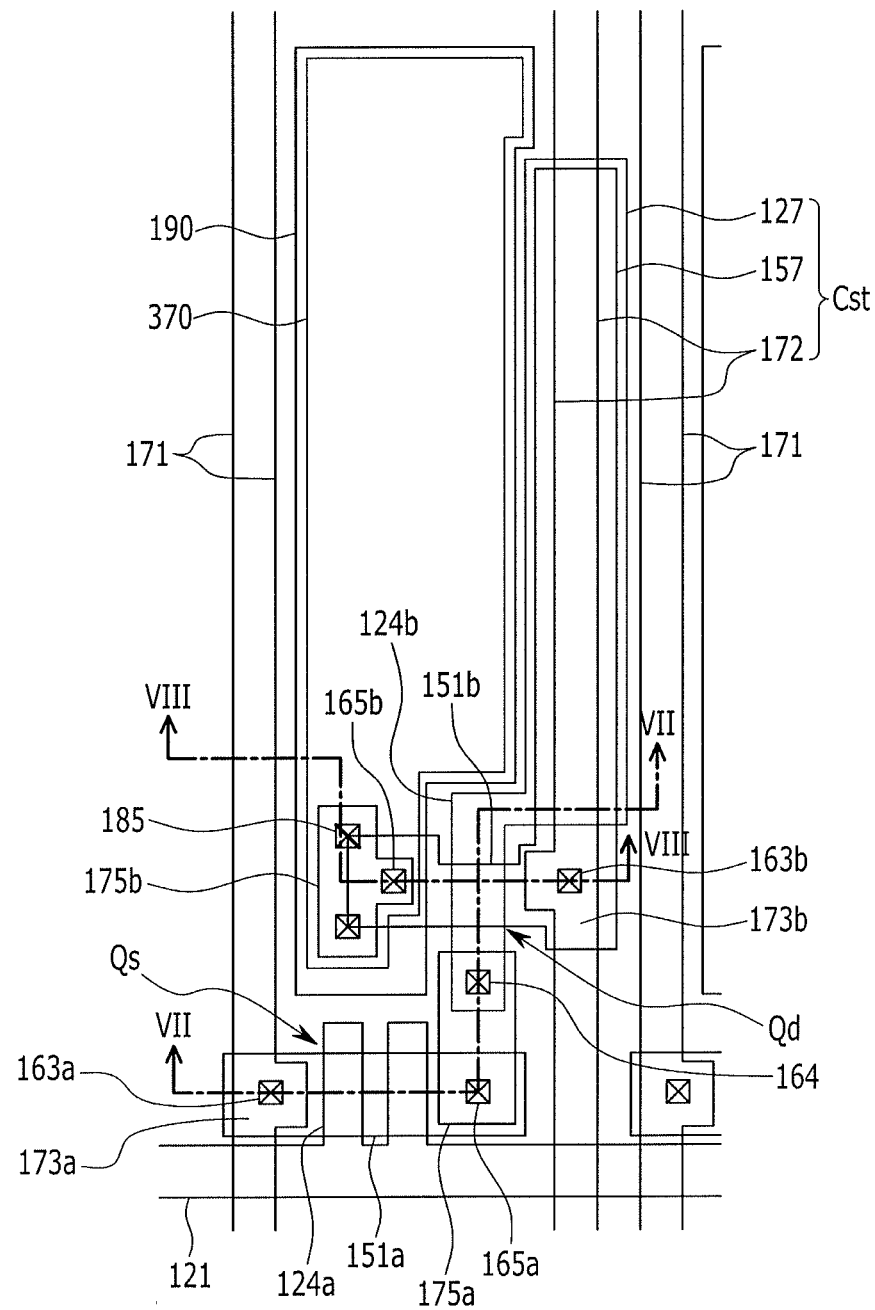
FIG. 6 illustrates a top plan view of a display device according to an exemplary embodiment.

A display device according to the exemplary embodiment will now be described with reference to FIG. 6 to FIG. 8. FIG. 6 illustrates a top plan view of a display device according to the exemplary embodiment, FIG. 7 illustrates a cross-sectional view taken along line VII-VII of FIG. 6, and FIG. 8 illustrates a cross-sectional view taken along line VIII-VIII of FIG. 6.

Figure 7:
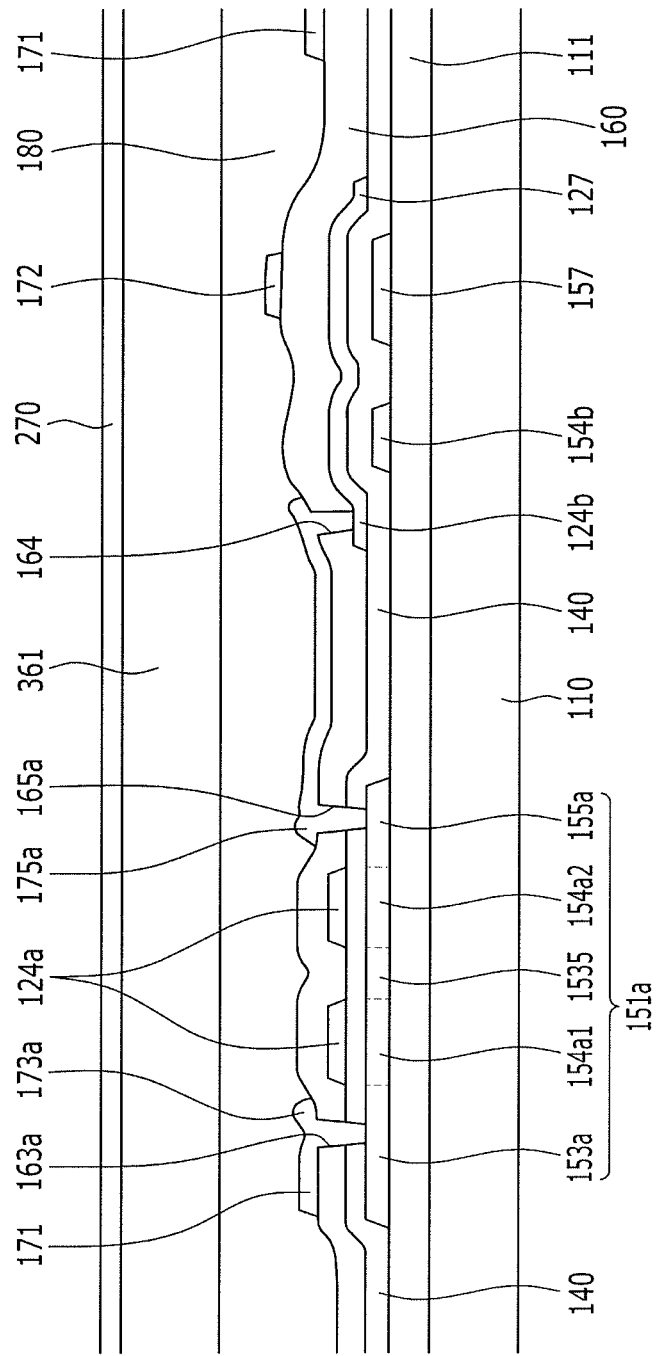
FIG. 7 illustrates a cross-sectional view taken along line VII-VII of FIG. 6.
Figure 8:
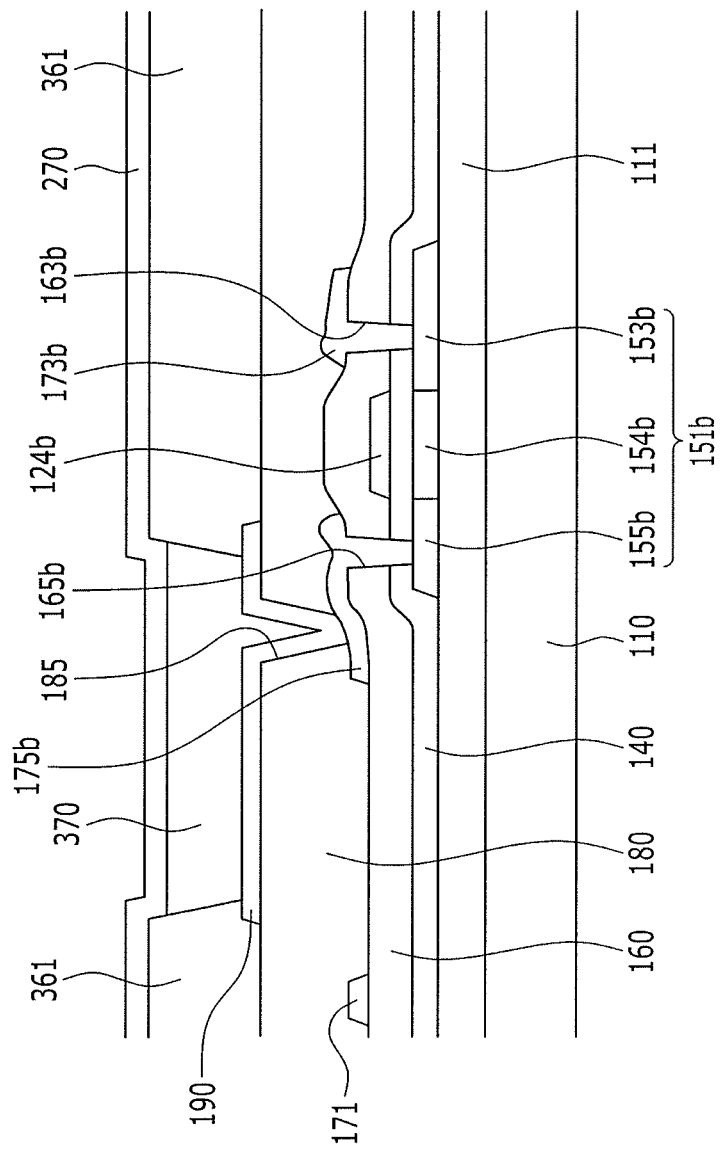
FIG. 8 illustrates a cross-sectional view taken along line VIII-VIII of FIG. 6.

Referring to FIG. 6 to FIG. 8, a blocking layer 111 made of a silicon oxide or a silicon nitride may be disposed on a substrate 110.

A plurality of pairs of first and second semiconductor layers 151a and 151b may be disposed on the blocking layer 111. Each of the first and second semiconductor layers 151a and 151b may include a plurality of extrinsic regions containing an n-type or p-type conductive impurity, and at least one intrinsic region hardly containing any conductive impurities.

The extrinsic region of the first semiconductor layer 151a may include first source and drain regions 153a and 155a and an intermediate region 1535. The first source region 153a, the first drain region 155a, and the intermediate region 1535 may be doped with the n-type impurity and may be spaced apart from each other. The intrinsic region may include a pair of first channel regions 154a1 and 154a2 disposed between the extrinsic regions 153a, 1535, and 155a.

The extrinsic region of the second semiconductor layer 151b may include a second source region 153b and a second drain region 155b. The second source region 153b and the second drain region 155b may be doped with the p-type impurity and may be spaced apart from each other. The intrinsic region may include a second channel region 154b disposed between the second source and drain regions 153b and 155b and a storage region 157 extending upward from the second drain region 153b.

In some implementations, the extrinsic regions 153a and 155a of the first semiconductor island 151a may be doped with p-type impurities, and the extrinsic regions 153b and 155b of the second semiconductor island 151b may be doped with n-type impurities. A gate insulating layer 140 made of a silicon nitride or silicon oxide may be formed on the semiconductor islands 151a and 151b and the blocking layer 111.

A gate line 121 including a first control electrode 124a and a gate conductor including a second control electrode 124b may be disposed on the gate insulating layer 140.

The gate line 121 may transmit a gate signal. The gate line 121 may generally extend in a horizontal direction. The first control electrode 124a may extend from the gate line 121 (for example, in an upward direction in FIG. 6) to cross the first semiconductor layer 151a, thereby overlapping the first channel regions 154a1 and 154a2.

The second control electrode 124b may be spaced apart from the gate line 121 and may overlap the second channel region 154b of the second semiconductor layer 151b. The second control electrode 124b may extend to form a storage electrode 127. The storage electrode 127 may overlap the storage region 157 of the second semiconductor layer 151b.

An interlayer insulating layer 160 may be positioned on the gate conductor and the gate insulating layer 140.

The interlayer insulating layer 160 may include a contact hole 164 exposing the second control electrode 124b. The interlayer insulating layer 160 and the gate insulating layer 140 may include contact holes 163a, 163b, 165a, and 165b exposing the source regions and the drain regions 153a, 153b, 155a, and 155b.

A data conductor including a data line 171, a driving voltage line 172, and first and second output electrodes 175a and 175b may be positioned on the interlayer insulating layer 160.

The data line 171 may transmit a data signal. The data line 171 may extend mainly in a longitudinal direction, thereby crossing the gate line 121. Each data line 171 may include a first input electrode 173a connected to the first source region 153a through the contact hole 163a.

The driving voltage line 172 may transmit a driving voltage. The driving voltage line 172 may extend mainly in the longitudinal direction, thereby crossing the gate line 121. Each driving voltage line 172 may include a second input electrode 173b connected to the second source region 153b through the contact hole 163b. The driving voltage line 172 may overlap the storage electrode 127. The driving voltage line 172 and the storage electrode 127 may be connected to each other.

The first output electrode 175a may be spaced apart from the data line 171 and the driving voltage line 172. The first output electrode 175a may be connected to the first drain region 155a through the contact hole 165a and may be connected to the second control electrode 124b through the contact hole 164.

The second output electrode 175b may be spaced apart from the data line 171, the driving voltage line 172, and the first output electrode 175a. The second output electrode 175b may be connected to the second drain region 155b through the contact hole 165b.

A passivation layer 180 may be positioned on the data conductors 171, 172, 175a, and 175b and the interlayer insulating layer 160. The passivation layer 180 may include a contact hole 185 exposing the second output electrode 175b.

A pixel electrode 190 may be positioned on the passivation layer 180. The pixel electrode 190 may be physically and electrically connected to the second output electrode 175b through the contact hole 185. A partition 361 may be positioned on the passivation layer 180. The partition 361 may define a plurality of openings that enclose edges of the pixel electrodes 191 in a form of a bank. A light emitting element layer (or a light emitting element layer) 370 may be positioned on the pixel electrode 190, and a common electrode 270 may be positioned on the light emitting element layer 370. The light emitting diode (or light emitting element) may include the pixel electrode 190, the light emitting diode layer 370, and the common electrode 270.

The light emitting diode or light emitting element may correspond to the light emitting diode 1 or 1' as illustrated in FIGS. 1 and 5. The pixel electrode 190 may correspond to the anode which is the hole injection electrode, i.e., the above-described first electrode 10, and the common electrode 270 may correspond to the cathode which is the electron injection electrode, i.e., the above-described second electrode 50. In some implementations, according to a driving method of the display device, the pixel electrode 190 may be a cathode and the common electrode 270 may be an anode.

The light emitting diode layer 370 may include the mixture layer 30 described with reference to FIG. 1 to FIG. 5. A r description thereof is not repeated.

The common electrode 270 may be positioned on the light emitting diode layer 370. The common electrode 270 may receive a common voltage. The structure of the described display device is one example, and the light emitting diode according to the exemplary embodiment may be clearly applied to a display device having a different structure.

In the above-described organic light emitting diode display device, the first semiconductor layer 151a, the first control electrode 124a connected to the gate line 121, the first input electrode 173a connected to the data line 171, and the first output electrode 175a may form a switching transistor (switching TFT) Qs. The channel of the switching transistor Qs may be formed in the channel regions 154a1 and 154a2 of the first semiconductor layer 151a. The second semiconductor layer 151b, the second control electrode 124b connected to the first output electrode 175a, the second input electrode 173b connected to the driving voltage line 172, and the second output electrode 175b connected to the pixel electrode 190 may form a driving transistor (driving TFT) Qd. The channel of the driving transistor Qd may be formed in the channel region 154b of the second semiconductor layer 151b. The pixel electrode 190, the light-emitting element layer 370, and the common electrode 270 may form the organic light emitting diode. The pixel electrode 191 may be an anode and the common electrode 270 may be a cathode. Conversely, in some implementations, the pixel electrode 191 may be a cathode and the common electrode 270 may be an anode. The storage electrode 127, the driving voltage line 172, and the storage region 157 overlapping each other may form a storage capacitor Cst.

By way of summation and review, an organic light emitting diode display device generally requires a high driving voltage, generates low light emitting luminance or efficiency, has a short light-emitting lifespan, and creates an imbalance of electrons and holes because the holes are not readily injected into a light emitting layer from a hole transporting layer.

Embodiments provide a light emitting diode including a quantum dot and a display device including the same. According to embodiments, the hole transporting material, the electron transporting material, and the quantum dot may be combined to form a single layer. In this case, the hole transporting material and the electron transporting material may contact the quantum dot over a wider area, such that injection of holes and electrons may be easily performed. The efficiency for injecting holes and electrons into the light emitting diode is improved such that the light emitting diode and display device may have excellent light emitting efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A light emitting diode, comprising:
a first electrode;
a second electrode facing the first electrode; and
a mixture layer between the first electrode and the second electrode,
wherein the mixture layer includes a mixture of quantum dots, a hole transporting material, and an electron transporting material such that portions of the hole transporting material and the electron transporting material directly contact each other.

2. The light emitting diode as claimed in claim 1, wherein the mixture layer includes a plurality of quantum dots located along a direction parallel to one surface of the first electrode.

3. The light emitting diode as claimed in claim 1, wherein the hole transporting material includes at least one of an organic material and an inorganic material.

4. The light emitting diode as claimed in claim 1, wherein areas of the hole transporting material and the electron transporting material contacting the quantum dot are equal.

5. The light emitting diode as claimed in claim 1, further comprising:
a hole transporting layer between the first electrode and the mixture layer; and
an electron transporting layer between the mixture layer and the second electrode.

6. The light emitting diode as claimed in claim 3, wherein the hole transporting material includes one or more inorganic materials selected from a p-type oxide semiconductor including CuO, CuO$_2$, NiO, CuI, or ZnTe, a telluride, and a halide.

7. The light emitting diode as claimed in claim 3, wherein the hole transporting material includes one or more organic materials selected from poly(3,4-ethylenedioxythiophene) polystyrene sulfonate (PEDOT:PSS), poly-peri-naphthalene (PPN), poly-p-phenylene (PpP), polythiophene (PT), C$_{60}$, 2,9-dimethyl-4-7-diphenyl-1,10 phenanthroline (BCP), bathophenanthroline (Bphen), poly(3-hexyl thiophene) (P3HT), and 2,2',7,7'-tetrakis(N,N-di-p-methoxyphenylamine)9,9'-spiro-bifluorene (OMeTAD).

8. The light emitting diode as claimed in claim 1, wherein the electron transporting material includes an inorganic material.

9. The light emitting diode as claimed in claim 8, wherein the inorganic material includes one or more selected from an n-type oxide semiconductor including ZnO, TiO$_2$, or FeF$_2$, and a halide.

10. The light emitting diode as claimed in claim 1, wherein:
the mixture layer includes a plurality of monomeric structures, and
at least one of the plurality of monomeric structures includes at least one quantum dot and the hole transporting material and the electron transporting material, wherein the hole transporting material and the electron transporting material surround the quantum dot.

11. The light emitting diode as claimed in claim 10, wherein
the hole transporting material and the electron transporting material surrounding the quantum dot are alternately disposed.

12. The light emitting diode as claimed in claim 10, wherein
at least one of the plurality of monomeric structures includes a plurality of quantum dots.

13. A display device, comprising:
a substrate;
a transistor disposed on the substrate; and
a light emitting diode connected to the transistor,
wherein the light emitting diode includes
a first electrode,
a second electrode facing the first electrode, and
a mixture layer between the first electrode and the second electrode,
wherein the mixture layer includes a mixture of quantum dots, a hole transporting material, and an electron transporting material such that portions of the hole transporting material and the electron transporting material directly contact each other.

14. The display device as claimed in claim 13, wherein the mixture layer includes a plurality of quantum dots disposed along a direction parallel to one surface of the first electrode.

15. The display device as claimed in claim 13, wherein areas of the hole transporting material and the electron transporting material contacting the quantum dot are equal.

16. The display device as claimed in claim 13, further comprising:
a hole transporting layer between the first electrode and the mixture layer; and
an electron transporting layer between the mixture layer and the second electrode.

17. The display device as claimed in claim 13, wherein
the mixture layer includes a plurality of monomeric structures, and
at least one of the plurality of monomeric structures includes at least one quantum dot and the hole transporting material and the electron transporting material that surround the quantum dot.

18. The display device as claimed in claim 17, wherein the hole transporting material and the electron transporting material surrounding the quantum dot are alternately disposed.

19. The display device as claimed in claim 17, wherein
at least one of the plurality of monomeric structures includes a plurality of quantum dots.

* * * * *